(12) United States Patent
Vilhonen

(10) Patent No.: US 9,257,999 B1
(45) Date of Patent: Feb. 9, 2016

(54) COMPENSATING FOR A KNOWN MODULATED INTERFERER TO A CONTROLLED OSCILLATOR OF A PHASE-LOCKED LOOP

(71) Applicant: Telefonaktiebolaget L M Ericsson (publ)

(72) Inventor: Sami Vilhonen, Lieto (FI)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/449,468

(22) Filed: Aug. 1, 2014

(51) Int. Cl.
*H03L 7/06* (2006.01)
*H03L 7/093* (2006.01)
*H03L 7/099* (2006.01)

(52) U.S. Cl.
CPC .............. *H03L 7/093* (2013.01); *H03L 7/099* (2013.01)

(58) Field of Classification Search
USPC ................................. 327/147–149, 156–158
See application file for complete search history.

(56) References Cited

U.S. PATENT DOCUMENTS

| | | | |
|---|---|---|---|
| 4,688,003 A | 8/1987 | Stromswold | |
| 5,311,546 A | 5/1994 | Paik et al. | |
| 5,541,959 A | 7/1996 | Myers | |
| 6,314,145 B1 | 11/2001 | van Driest | |
| 6,587,521 B1 | 7/2003 | Matui | |
| 6,985,705 B2 | 1/2006 | Shohara | |
| 7,372,337 B2 * | 5/2008 | Nayler | 331/16 |
| 7,405,628 B2 * | 7/2008 | Hulfachor et al. | 331/11 |
| 7,551,677 B2 | 6/2009 | Crawford | |
| 8,093,943 B2 | 1/2012 | Arai | |
| 8,154,329 B2 | 4/2012 | Ecklund et al. | |
| 8,198,930 B2 * | 6/2012 | Zerbe et al. | 327/261 |
| 8,222,939 B2 | 7/2012 | Takinami et al. | |
| 8,339,208 B2 | 12/2012 | Luong et al. | |

(Continued)

FOREIGN PATENT DOCUMENTS

| | | |
|---|---|---|
| EP | 1304805 A2 | 4/2003 |
| EP | 2600544 A1 | 6/2013 |
| WO | 2010089168 A1 | 8/2010 |

OTHER PUBLICATIONS

Author Unknown, "3rd Generation Partnership Project; Technical Specification Group Radio Access Network; Evolved Universal Terrestrial Radio Access (E-UTRA); User Equipment (UE) radio transmission and reception (Release 11)," Technical Specification 36.101, Version 11.4.0, Mar. 2013, 3GPP Organizational Partners, 401 pages.

(Continued)

*Primary Examiner* — Adam Houston
(74) *Attorney, Agent, or Firm* — Withrow & Terranova, PLLC

(57) ABSTRACT

Systems and methods for compensating for a known interferer to a Controlled Oscillator (CO) of a Phase-Locked Loop (PLL) are disclosed. In one embodiment, a system includes a PLL and a compensation system. The compensation system is configured to generate a compensation signal based on a complex correlation of an output signal of a phase detector of the PLL and a signal derived from a replica of a known interferer to the CO. The compensation system is further configured to apply the compensation signal to the control signal provided by the low-pass filter of the phase-locked loop to thereby provide the compensated control signal for the CO of the phase-locked loop. In this manner, the compensation system mitigates the known interferer at the CO of the PLL.

23 Claims, 8 Drawing Sheets

(56) References Cited

U.S. PATENT DOCUMENTS

| | | |
|---|---|---|
| 8,384,452 B1 | 2/2013 | Parker et al. |
| 2002/0105389 A1 | 8/2002 | Nishimura et al. |
| 2004/0119514 A1 | 6/2004 | Karlquist |
| 2004/0120418 A1* | 6/2004 | Pasternak et al. ............. 375/272 |
| 2004/0189361 A1* | 9/2004 | Jung ............................ 327/158 |
| 2005/0186920 A1 | 8/2005 | Staszewski et al. |
| 2006/0103566 A1* | 5/2006 | Vemulapalli et al. ......... 341/155 |
| 2007/0194811 A1 | 8/2007 | Nitsche et al. |
| 2008/0192877 A1 | 8/2008 | Eliezer et al. |
| 2010/0315169 A1 | 12/2010 | Filipovic et al. |
| 2011/0187426 A1* | 8/2011 | Moore .......................... 327/157 |
| 2011/0299572 A1* | 12/2011 | Monsen et al. ............... 375/214 |
| 2013/0229213 A1* | 9/2013 | Park et al. ..................... 327/157 |
| 2013/0243044 A1 | 9/2013 | Husted et al. |
| 2013/0271186 A1 | 10/2013 | Hossain et al. |
| 2014/0347108 A1* | 11/2014 | Zerbe et al. .................. 327/158 |

OTHER PUBLICATIONS

Mirzaei, Ahmad et al., "21.8 A Pulling Mitigation Technique for Direct-Conversion Transmitters," 2014 IEEE International Solid-State Circuits Conference, Session 21, San Francisco, CA, Feb. 9-13, 2014, IEEE, pp. 374-375.

Non-Final Office Action for U.S. Appl. No. 14/259,485, mailed Jul. 30, 2015, 8 pages.

Non-Final Office Action for U.S. Appl. No. 14/264,506, mailed Aug. 20, 2015, 6 pages.

International Search Report for International Patent Application No. PCT/EP2015/058283, mailed Jul. 14, 2015, 3 pages.

International Search Report for International Patent Application No. PCT/EP2015/058982, mailed Jul. 24, 2015, 4 pages.

International Search Report for International Patent Application No. PCT/EP2015/064623, mailed Nov. 16, 2015, 3 pages.

* cited by examiner

COMPENSATING FOR A KNOWN MODULATED INTERFERER TO A CONTROLLED OSCILLATOR OF A PHASE-LOCKED LOOP

FIELD OF THE DISCLOSURE

The present disclosure relates to compensating for interference in a local oscillator output signal of a Phase-Locked Loop (PLL).

BACKGROUND

Third Generation Partnership Project (3GPP) Long Term Evolution (LTE) specifications starting with LTE Release 11 utilize carrier aggregation. Carrier aggregation is a technique by which multiple frequency bands, which for LTE are multiple 20 Megahertz (MHz) frequency bands, are aggregated for downlink or uplink transmission. A 3GPP LTE cellular transceiver that supports carrier aggregation can be configured to simultaneously transmit in multiple frequency bands and/or simultaneously receive in multiple frequency bands.

Currently, there is high interest in a single-chip cellular transceiver that supports carrier aggregation. One of the many design challenges for such a transceiver is Local Oscillator (LO) frequency planning. LO frequency planning refers to the selection of the LO frequencies. In order to operate according to a carrier aggregation scheme, a single-chip cellular transceiver includes multiple Phase-Locked Loops (PLLs) to generate LO signals necessary for downconversion and/or upconversion for multiple frequency bands. The number of different frequency band combinations that have to be supported by the single-chip cellular transceiver for carrier aggregation is large and new combinations are being introduced all the time. Many of these combinations require multiple PLLs to be enabled simultaneously.

One challenge in frequency planning that is particularly problematic for a single-chip carrier aggregation cellular transceiver comes from the fact that the Controlled Oscillators (COs) in the PLLs are sensitive to interference. For example, two PLLs running at the same frequency, or approximately the same frequency, interfere with each other. This interference degrades the noise performance of the PLLs. This same problem occurs if the PLLs run at frequencies that have a harmonic relation (i.e., a harmonic of the LO frequency of one PLL is the same as or approximately the same as the LO frequency of another PLL). In a receiver, this interference results in degradation of throughput due to phase noise sidebands in the LO signal used for downconversion. During downconversion (i.e., mixing), these phase noise sidebands mix parts of the received signal on top of itself. Still further, interference to a CO in a PLL is not limited to interference from a CO of another PLL. For example, in a wireless transmitter or transceiver, a harmonic of a modulated transmit signal may interfere with the CO of a PLL used to, e.g., generate a clock signal for upconversion in the transmitter or downconversion in the receiver.

Commonly owned and assigned U.S. patent application Ser. No. 14/259,485 discloses systems and methods for mitigating crosstalk between COs of PLLs. In this application, the systems and methods are used to compensate for a Continuous Wave (CW) crosstalk signal (interference) from the CO of one PLL to the CO of another PLL in the system. In general, a compensation signal is generated at an offset frequency that is approximately equal to an offset between the frequency of a first CO and the frequency of a second CO. The compensation signal is applied to the first CO to thereby compensate for a crosstalk signal from the second CO to the first CO. One issue with these systems and methods is that they provide compensation for only the CW crosstalk signal. However, in some systems, there may be modulated interferers and, as such, there is a need for systems and methods for compensating for modulated interferers.

Commonly owned and assigned U.S. patent application Ser. No. 14/264,506 discloses systems and methods for mitigating interference in a LO output signal generated by a PLL. In one embodiment, a system includes a PLL and an error compensation subsystem. Based on the output signal of the phase detector in the PLL, the error compensation subsystem applies a phase rotation to a signal derived from the LO output signal to compensate for a phase error in the signal resulting from a phase error in the LO output signal indicated by the phase detector output signal. Since the bandwidth of the phase detector is substantially larger than the bandwidth of the PLL, these systems and methods enable compensation for interferers that fall outside of the bandwidth of the PLL but inside the bandwidth of the phase detector. These interferes may be modulated signals. However, these systems and methods are limited by the Signal-to-Noise Ratio (SNR) of the phase detector. This means that the systems and methods disclosed in Ser. No. 14/264,506 can be used in frequency areas where the phase detector noise is less than the PLL noise. Thus, there is a need for systems and methods for compensating for modulated interferers that are not limited by the SNR of the phase detector of the PLL.

SUMMARY

Systems and methods for compensating for a known interferer to a Controlled Oscillator (CO) of a Phase-Locked Loop (PLL) are disclosed. In one embodiment, a system includes a PLL and a compensation system. The PLL includes a phase detector configured to generate a phase detector output signal indicative of a phase difference between a reference signal and a feedback signal. The feedback signal is indicative of a Local Oscillator (LO) output signal generated by the PLL. The PLL also includes a low-pass filter configured to filter the phase detector output signal to provide a control signal, and a CO configured generate the LO output signal of the PLL based on a compensated control signal. The compensation system is configured to generate a compensation signal based on a complex correlation of the phase detector output signal and a signal derived from a replica of a known interferer to the CO. The compensation system is further configured to apply the compensation signal to the control signal provided by the low-pass filter of the PLL to thereby provide the compensated control signal for the CO of the PLL. In this manner, the compensation system mitigates the known interferer at the CO of the PLL.

In one embodiment, the known interferer is a modulated signal, and the replica of the known interferer is also a modulated signal.

In one embodiment, the compensation system includes a complex correlator configured to perform a complex correlation of the signal derived from the replica of the known interferer and the phase detector output signal to provide a correlation signal. The compensation system further includes circuitry configured to process the correlation signal and the replica of the known interferer to provide the compensation signal, and combiner circuitry configured to combine the control signal from the low-pass filter of the PLL and the compensation signal to provide the compensated control signal for the CO of the PLL.

In one embodiment, the compensation system includes a complex correlator, a low-pass filter, a complex multiplier, and an adder. The complex correlator includes a first input configured to receive the signal derived from the replica of known interferer, a second input coupled to an output of the phase detector of the PLL, and an output. The complex correlator is configured to perform a complex correlation of the signal derived from the replica of the known interferer and the phase detector output signal to provide a correlation signal at the output of the complex correlator. The low-pass filter includes an input coupled to the output of the complex correlator and an output. The low-pass filter is configured to filter the correlation signal to provide a filtered correlation signal. The complex multiplier includes a first input configured to receive the replica of known interferer, a second input coupled to the output of the low-pass filter of the compensation system, and an output. The complex multiplier is configured to multiply the replica of the known interferer and the filtered correlation signal to provide a compensation signal at the output of the complex multiplier. The adder includes a first input coupled to an output of the low-pass filter of the PLL, a second input coupled to the output of the complex multiplier of the compensation system, and an output. The adder is configured to add the control signal from the low-pass filter of the PLL and the compensation signal from the multiplier of the compensation signal to provide the compensated control signal at the output of the adder.

In one embodiment, the compensation system further includes circuitry configured to compensate for an amplitude modulation of the LO output signal as a function of the compensated control signal provided to the CO. In one embodiment, the circuitry configured to compensate for the amplitude modulation of the LO output signal includes a look-up table configured to output a bias control signal as a function of the compensated control signal, and biasing circuitry configured to adjust a bias of the CO based on the bias control signal. In one embodiment, the biasing circuitry is configured to adjust a bias current of the CO based on the bias control signal. In another embodiment, the biasing circuitry is configured to adjust a supply voltage of the CO based on the bias control signal.

In one embodiment, the compensation system further includes one or more components configured to process the replica of the known interferer to compensate for one or more loop characteristics of the PLL to thereby provide the signal derived from the replica of the known interferer.

Those skilled in the art will appreciate the scope of the present disclosure and realize additional aspects thereof after reading the following detailed description of the embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
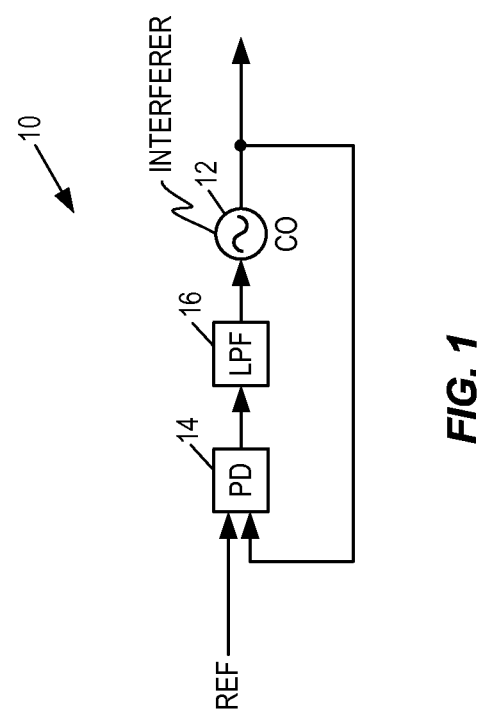
FIG. 1 illustrates a Phase-Locked Loop (PLL), where an interferer is injected into a Controlled Oscillator (CO) of the PLL.

Systems and methods for compensating for a known modulated interferer to a Controlled Oscillator (CO) of a Phase-Locked Loop (PLL) are disclosed. Prior to describing embodiments of the present disclosure, a brief discussion of a PLL 10 and the manner in which interference effects an output spectra of the PLL 10 is provided with respect to FIGS. 1 and 2. As illustrated in FIG. 1, the PLL 10 typically includes a CO 12 (e.g., a Digitally Controlled Oscillator (DCO) or a Voltage Controlled Oscillator (VCO)) that generates a LO signal at a desired LO frequency ($f_{LO}$) based on a control signal provided by the PLL 10. In this example, the control signal provided to the CO 12 is provided by a Phase Detector (PD) 14 and a loop filter 16, which is more specifically a Low-Pass Filter (LPF). In operation, the phase detector 14 compares a phase of a reference signal which is typically provided by a stable reference oscillator (e.g., a crystal oscillator) and a phase of a feedback signal that is a function of the LO signal output by the CO 12. In the illustrated example, the feedback signal is the LO signal. However, in other implementations, the PLL 10 also includes a divider in the feedback path that divides the LO signal output by the CO 12 by a factor (N) to provide the feedback signal for the phase detector 14. The phase detector 14 outputs a signal that is indicative of a phase error between the reference signal and the feedback signal. The output signal of the phase detector 14 is filtered by the loop filter 16 to provide the control signal for the CO 12.

Figure 2:
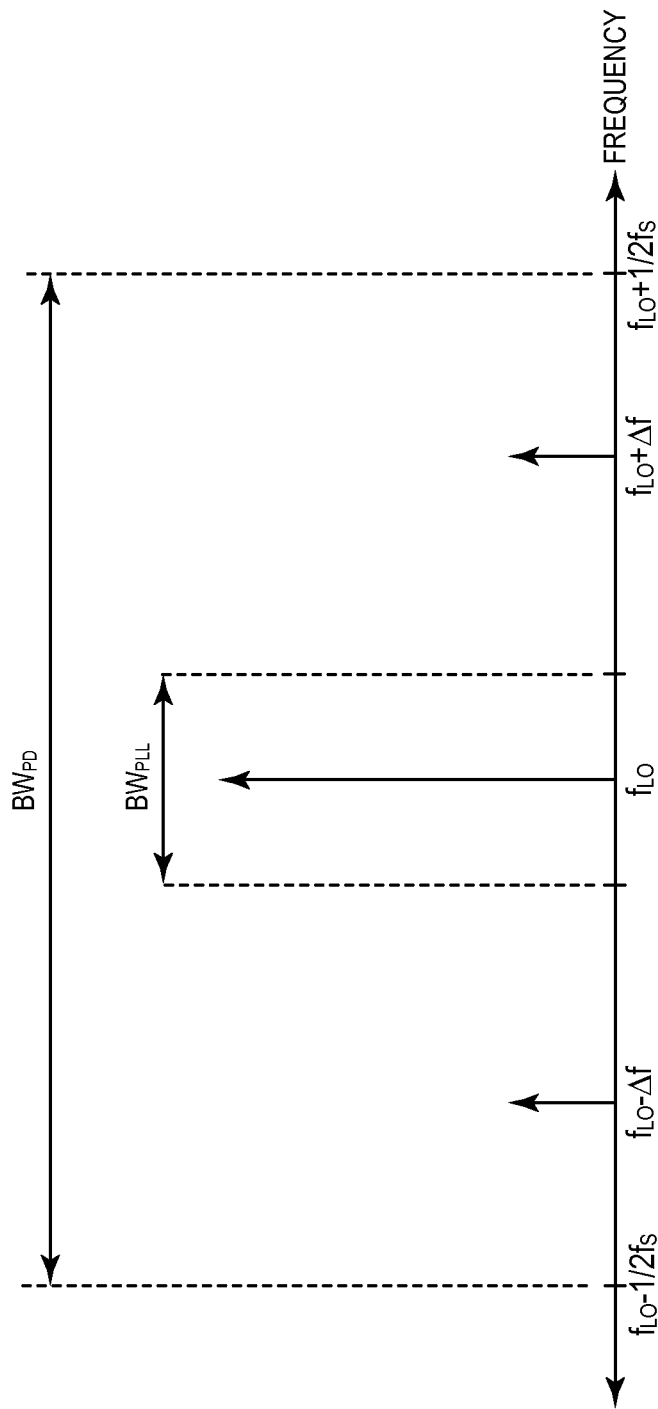
FIG. 2 illustrates an output spectrum of the PLL of FIG. 1.

As illustrated, an interferer is injected into the CO 12. The interferer is located at a frequency ($f_{INT}$), where in this example $f_{INT}=f_{LO}+\Delta f$. Alternatively, the frequency $f_{INT}$ may be equal to $f_{LO}-\Delta f$. In either case, the results are the same. The amplitude limiting function of the CO 12 converts the interferer into a phase modulation of the CO 12, which in turn results in a symmetric phase-modulated output spectra for the CO 12. As illustrated in FIG. 2, the symmetric phase-modulated output spectra for the CO 12 includes a first modulation sideband located at $f_{LO}+\Delta f$ (which is equal to $f_{INT}$ in this example) and a second modulation sideband located at $f_{LO}-\Delta f$, where $\Delta f=|f_{LO}-f_{INT}|$. If the interferer falls within a bandwidth of the PLL 10 ($BW_{PLL}$) (i.e., $\Delta f$ is small), then the interferer will be mitigated by the normal phase correction mechanism of the PLL 10. The bandwidth of the PLL 10 ($BW_{PLL}$) is typically small (e.g., about 100 kilohertz (kHz)). Note that the mitigation, or attenuation, of the interferer by the normal phase correction mechanism of the PLL 10 is finite (i.e., the PLL 10 will not completely cancel the interferer), and the amount of attenuation is inversely proportional to the frequency offset between the oscillator frequency ($f_{LO}$) and the interferer. While the PLL 10 is able to mitigate the interferer if the interferer falls within the bandwidth of the PLL ($BW_{PLL}$), the PLL 10 is not able to mitigate the interferer if the interferer is located outside of the bandwidth of the PLL 10 ($BW_{PLL}$) as illustrated in FIG. 2. In this case, the interferer is present in the LO signal output by the PLL 10 and, as such, performance of any systems that utilize the LO signal (e.g., a receiver or a transmitter) is degraded.

Embodiments of the present disclosure leverage the fact that a bandwidth of the phase detector 14 ($BW_{PD}$) is much wider than the bandwidth of the PLL 10 ($BW_{PLL}$), as also illustrated in FIG. 2. For example, if the phase detector 14 is a digital phase detector 14 that operates at a desired sampling rate ($f_S$) (e.g., 56 Megahertz (MHz)), then the bandwidth of the phase detector 14 extends from $f_{LO}-f_S/2$ to $f_{LO}+f_S/2$. As such, the phase detector 14 is capable of detecting the phase error of the interferer as long as $f_{INT}$ is in the range of $f_{LO} \pm f_S/2$. As discussed below, embodiments of the present disclosure utilize the output signal of the phase detector 14 to mitigate interference within the bandwidth of the phase detector 14 ($BW_{PD}$).

Figure 3:
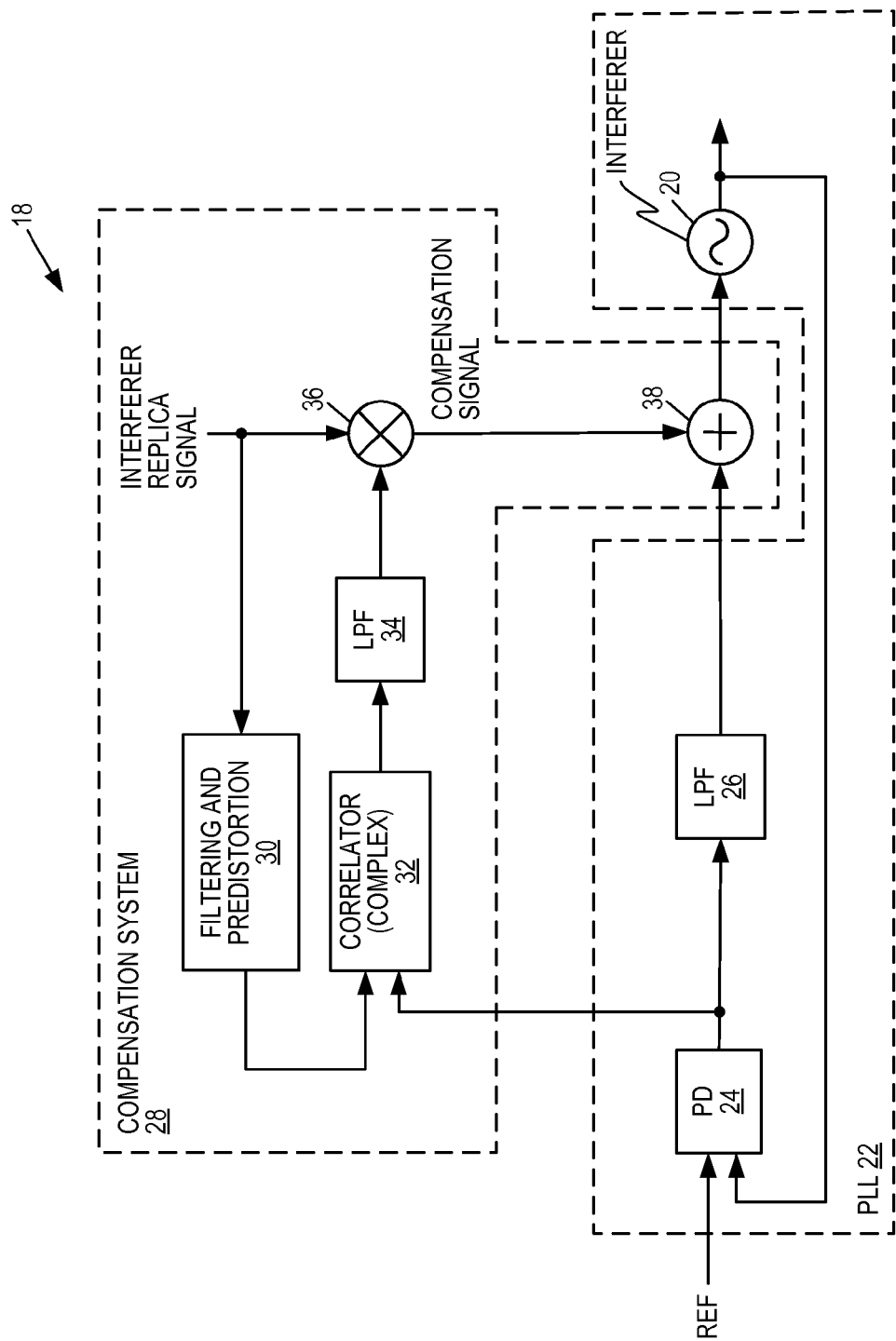
FIG. 3 illustrates a system that mitigates a known interferer to a CO of a PLL according to one embodiment of the present disclosure.

FIG. 3 illustrates a system 18 in which interference to a CO 20 of a PLL 22 is compensated for, or mitigated, by adjusting a control signal input to the CO 20 according to one embodiment of the present disclosure. In general, the interference is a known interferer and may, in some embodiments, be a modulated signal (e.g., a harmonic of a transmit signal of a wireless transmitter in an embodiment in which the system 18 is implemented as part of the wireless transmitter or a wireless transceiver including the wireless transmitter). In this embodiment, the PLL 22 includes the CO 20, which may be, e.g., a DCO or a VCO, a phase detector 24, and a loop filter 26. While not illustrated, the PLL 22 may include other components, depending on the particular implementation. For instance, the PLL 22 may further include a divider or phase quantizer in the feedback path. The phase detector 24 is a digital phase detector that measures a phase error between a feedback signal that is a function of the output of the CO 20 and a reference signal, which is provided by a stable reference oscillator such as, e.g., a crystal oscillator. In this example, the feedback signal is the output of the CO 20; however, in other embodiments, the feedback path may include, e.g., a frequency divider. The phase detector 24 outputs a signal at a sampling rate of the phase detector 24, where each sample of the output signal represents the instantaneous phase error. The loop filter 26 is a LPF utilized to provide loop stability and attenuation of high-frequency noise from the phase detector 24.

The phase detector 24 measures the phase error between the feedback signal and the reference signal and outputs the signal that is indicative of the measured phase error. For this example, an interferer (e.g., a harmonic of a transmit signal of a wireless transmitter implemented in the same integrated circuit) is present at or injected/leaked into the CO 20. As such, the measured phase error will also include an error due to the interferer. The feedback loop of the PLL 22 will correct some of the phase error caused by the interference, but some residual phase error will remain due to the limited bandwidth of the PLL 22. Further, the CO 20 is typically implemented as an Inductor Capacitor (LC) resonator, in which case the tolerance of the PLL 22, and in particular the CO 20, to interferers is further limited by the limited Q-value of the LC resonator. The interferer injected into the CO 20 results in modulation sidebands in the LO output signal of the CO 20.

In order to compensate for the interferer, the system 18 further includes a compensation system 28 that, in this embodiment, includes a filtering and predistortion subsystem 30, a correlator 32, a LPF 34 (or integrator), a multiplier 36, and an adder 38. Notably, the filtering and predistortion subsystem 30, the correlator 32, the LPF 34, and the multiplier 36 operate on complex signals and, therefore, are sometimes referred to herein as being "complex" components. As illustrated, the compensation system 28 receives an interferer replica signal. The interferer replica signal is a replica of the interferer to the CO 20, where the interferer is a known interferer. The interferer replica signal may be generated by, e.g., a system external to the system 18. For example, the interferer replica signal may be generated by a dedicated waveform generator (e.g., in the case of a continuous wave interferer). As another example, if a source of the interferer is an associated transmitter, then the interferer replica signal may be generated by copying the original signal from the transmitter chain, distorting and filtering this original signal as needed, and then adding the resulting signal to a waveform generator output. The filtering and predistortion subsystem 30 filters and/or predistorts the interferer replica signal to compensate for one or more loop characteristics of the PLL 22. In particular, even assuming that the interferer is located outside of the bandwidth of the PLL 22 but inside the bandwidth of the phase detector 24, the interferer will still be affected by loop characteristic(s) of the PLL 22 such as, for example, LC-resonator attenuation, phase detector non-idealities, and possible delay between replica signal and phase detector output. In other words, the PLL 22 will correct for the interferer, but at low frequencies due to the loop filter 26 (i.e., integrator) in the PLL 22. As such, the interferer replica signal is modified to account for the loop characteristic(s) of the PLL 22.

The correlator 32 performs a complex correlation of the output of the phase detector 24 and the output signal of the filtering and predistortion subsystem 30. The output signal of the filtering and predistortion subsystem 30 is also referred to herein as a signal derived from the interferer replica signal. The output signal of the correlator 32, which is referred to herein as a correlation signal, is indicative of a degree to which the interferer contributes to the phase difference, or phase error, detected by the phase detector 24. In particular, the correlation signal is indicative of a complex gain (i.e., both phase and magnitude) for the known interferer that is being detected via the correlation. The correlation signal is integrated by the LPF 34 to provide a filtered correlation signal. By integrating for a relatively long period of time, improved accuracy can be obtained, even in the presence of noise in the output of the phase detector 24. In other words, the correlation followed by integration provides detection of the known interferer even in the presence of noise in the output signal of the phase detector 24. In this manner, compensation is not limited by the Signal-to-Noise Ratio (SNR) of the output signal of the phase detector 24.

The multiplier 36 multiplies the filtered compensation signal output of the LPF 34 and the interferer replica signal to provide a compensation signal. The adder 38 adds the compensation signal and the output of the loop filter 26 (which is referred to herein as a control signal, or original control signal, of the CO 20) to thereby provide a compensated control signal for the CO 20. When added to the original control signal of the CO 20, the compensation signal adjusts the original control signal to compensate for, or counter-act, the effects of the interferer in the CO 20. In other words, the compensation signal is effectively the opposite of (or inversion of) the interferer. In operation, the correlation loop (i.e., the loop formed by the correlator 32, the LPF 34, the multiplier 36, the adder 38, etc.) operates to minimize the correlation signal, which in turn mitigates the interferer in the CO 20. The compensated control signal is then applied to the CO 20 (e.g., applied to control one or more capacitor banks of the CO 20). By controlling the CO 20 with the compensated control signal, the interferer is mitigated.

Notably, in some implementations, the CO 20 includes one or more capacitor banks that may have varying Q as a function of the compensated control signal input to the CO 20. When the Q of the CO 20 changes, from that point in time onward, each cycle consumes more power, which in turn starts to lower the output voltage of the CO 20. The time constant of this effect is fairly close to that of a power supply (e.g., 1 MHz). As such, the CO 20 takes a long time (relative to the speed of capacitance value change with constant Q-value, which may be, for example, hundreds of MHz) to reach a stable amplitude after switching the capacitance in response to a change in the compensated control signal. This results in a memory effect and, therefore, Amplitude Modulation (AM) of the CO output signal. Also, because some AM to Phase Modulation (PM) conversion is always present in the CO 20, some PM will also be present.

Figure 4:
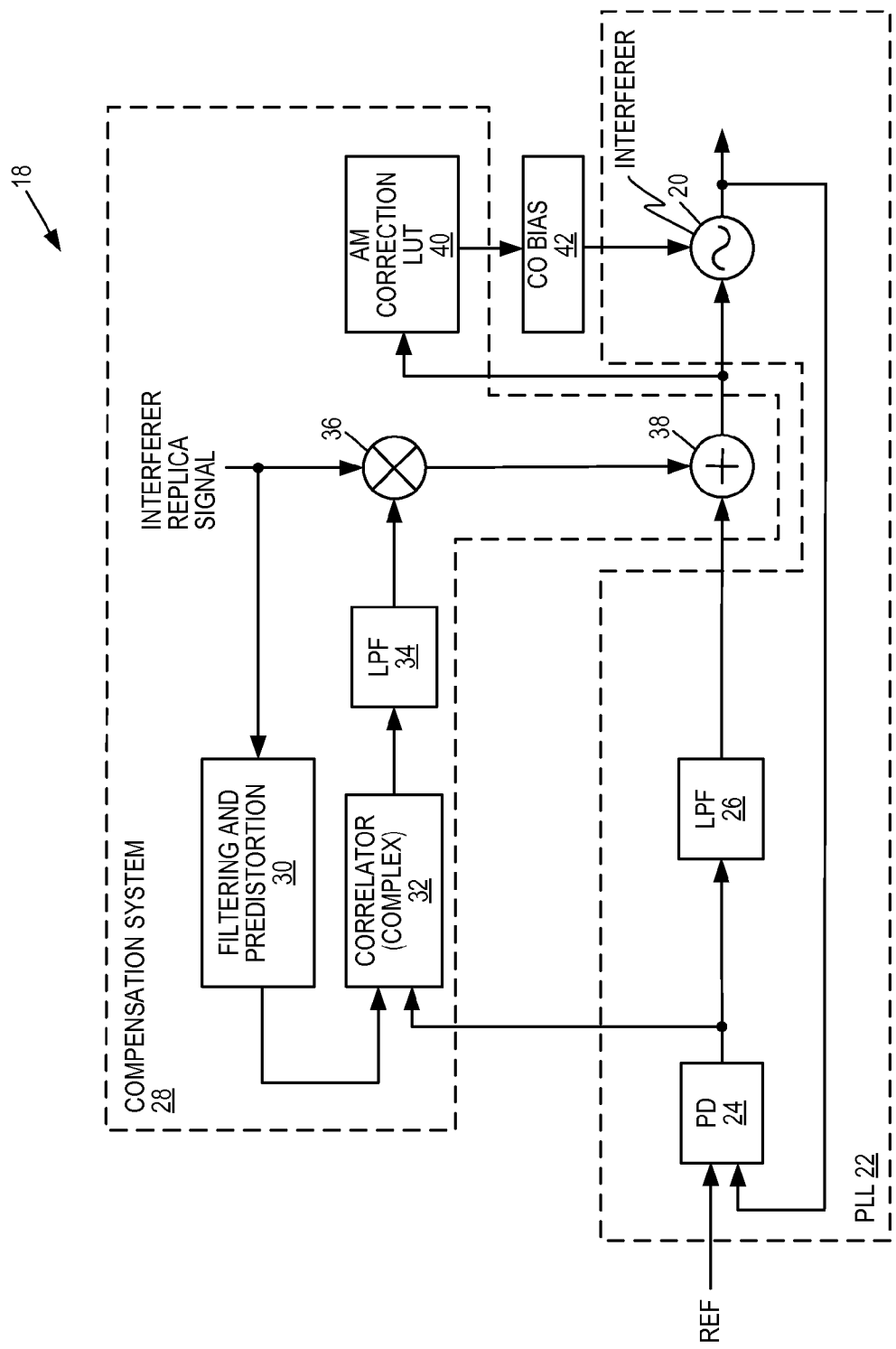
FIG. 4 illustrates a system that mitigates a known interferer to a CO of a PLL according to another embodiment of the present disclosure.

FIG. 4 illustrates the system 18 according to another embodiment of the present disclosure in which the compensation system 28 further includes an AM correction loop. In general, the AM correction loop operates to correct the AM issue described above. In one particular embodiment, the AM correlation loop operates to adjust a bias of the CO 20 (e.g., a current bias of the CO 20) in such a manner as to compensate for the variation of Q as a function of the compensated control signal. For example, if the compensated control signal changes such that Q decreases, then the AM correction loop may increase the bias current by an amount that compensates for the decrease in Q.

In this embodiment, the AM correction loop includes an AM correction Look-Up Table (LUT) 40 and a CO bias component 42. The AM correction LUT 40 receives the compensated control signal and, for each sample of the compensated control signal, outputs a corresponding AM correction value. The AM correction value controls the bias of the CO 20 (e.g., current bias or supply voltage bias) via the CO bias component 42. The CO bias component 42 may be, for example, a current Digital-to-Analog Converter (DAC) that converts the AM correction value to a corresponding bias current applied to the CO 20. However, the CO bias component 42 is not limited thereto. The AM correction LUT 40 may be calibrated using any suitable technique. For example, the AM correction LUT 40 may be calibrated during operation or during manufacturing by monitoring the amplitude or frequency of the output signal of the CO 20 in response to different values of the control signal input to the CO 20. As another example, the AM correction LUT 40 may be calibrated based on simulations.

Figure 5:
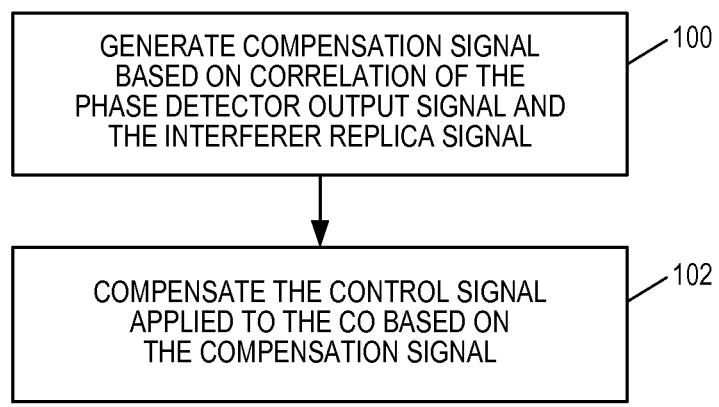
FIG. 5 is a flow chart that illustrates a process for mitigating a known interferer to a CO of a PLL according to one embodiment of the present disclosure.

FIG. 5 is a flow chart that illustrates a process for compensating for a known interferer to a CO of a PLL according to one embodiment of the present disclosure. In this example, the process is described with respect to the CO 20, the PLL 22, and the compensation system 28, but is not limited thereto. As illustrated, the compensation signal is generated based on a complex correlation of the phase detector output signal and the signal derived from the interferer replica signal (step 100). The control signal applied to the CO 20 is then compensated based on the compensation signal (step 102). More specifically, as discussed above, the compensation signal is combined with the original control signal to provide the compensated control signal for the CO 20. The compensation signal is effectively the opposite of the interferer such that the interferer is mitigated.

Figure 6:
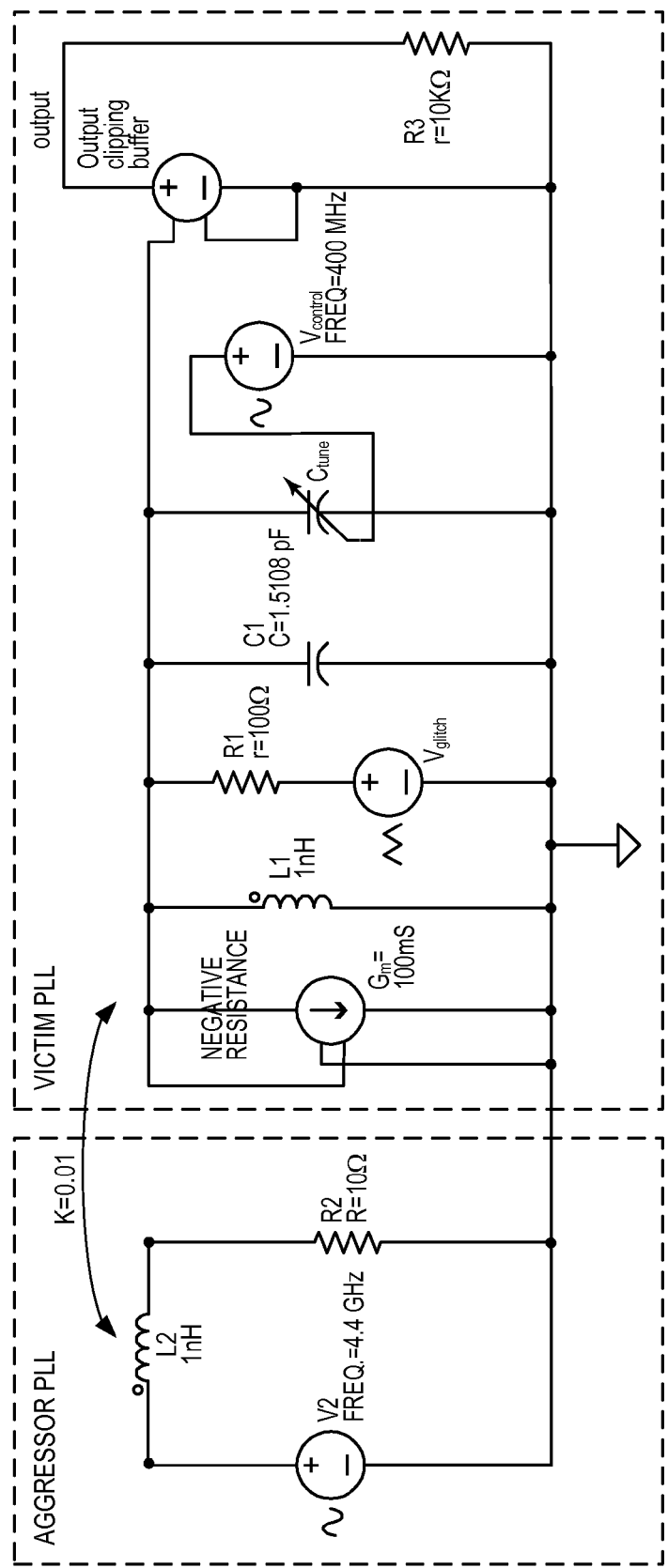
FIGS. 6 through 8 illustrate a simulation set-up and simulation results for one example implementation of the system of FIG. 3.
Figure 7:
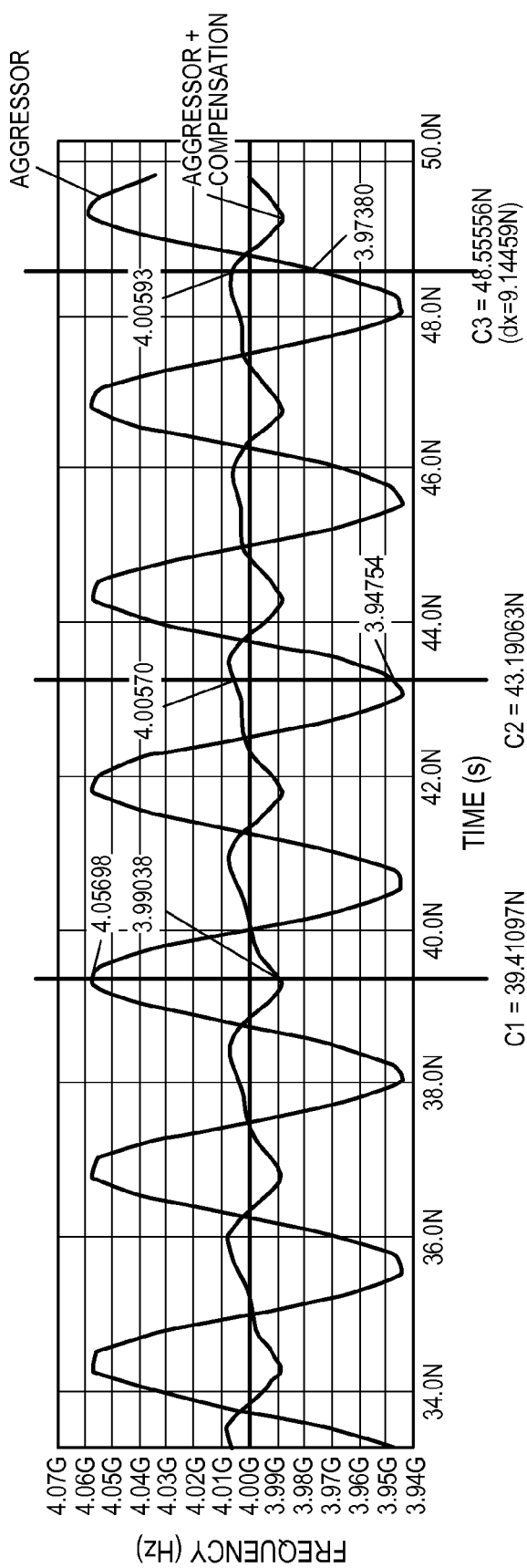
Figure 8:
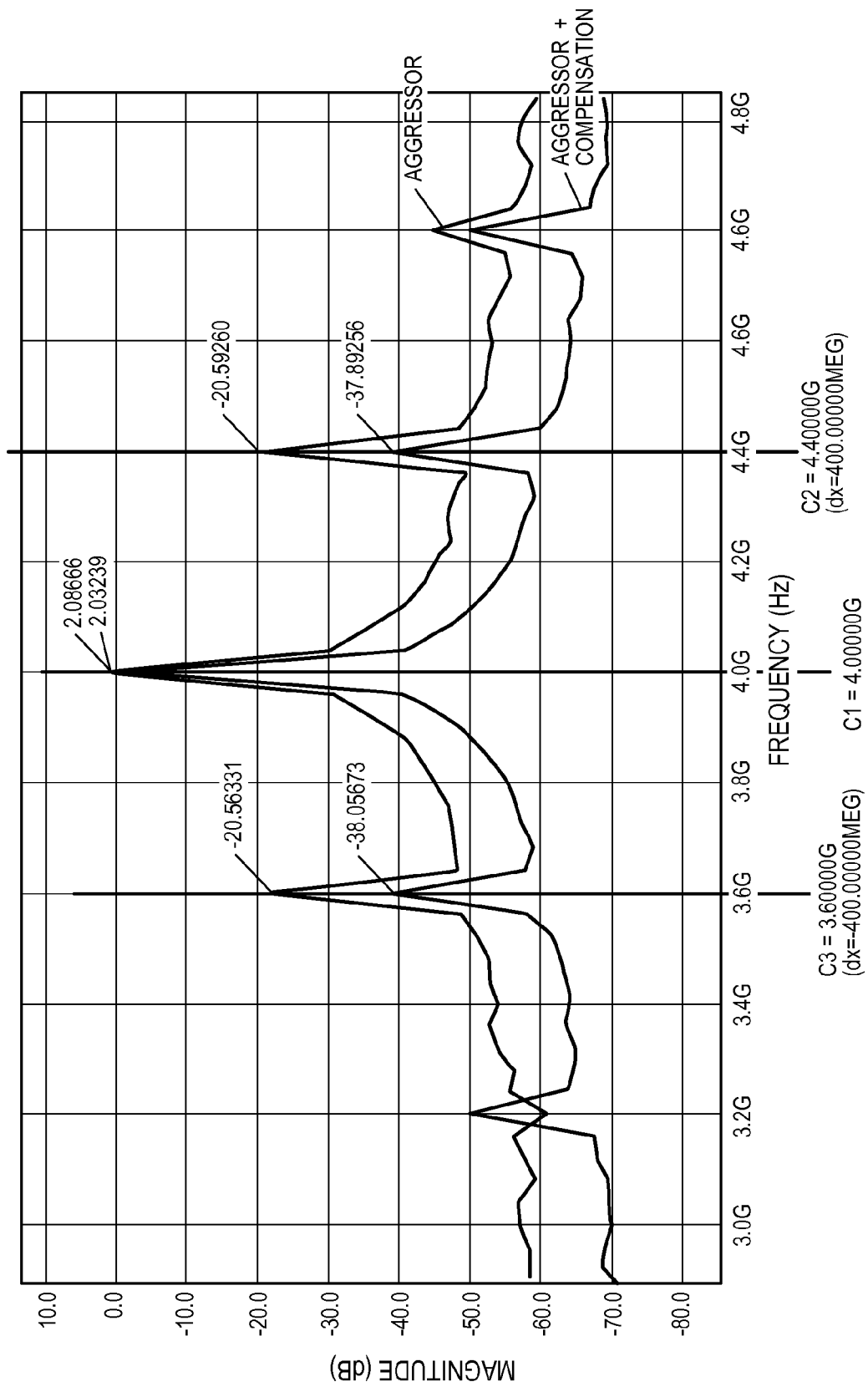

FIGS. 6-8 illustrate a simulation and simulation results for one example implementation of the system 18 of FIG. 3. As illustrated in FIG. 6, the interferer is modeled as an aggressor VCO shown as a sine wave (generated by a voltage source V2 at a frequency of 4.4 Gigahertz (GHz)) in a coil, or inductor L2, with a small coupling factor (K=0.01) to the coil, or inductor (L1), of the CO of the victim PLL. The CO of the victim PLL (i.e., the CO 20 of the PLL 22), which in this case is a VCO, is modeled by an ideal clipping Gm source ($G_m$=100 milli-Siemens (mS)), inductor (L1), capacitor (C1), resistor (R1) (with voltage glitch ($V_{glitch}$) for startup), and tunable voltage controlled capacitor (C tune). The output of the VCO of the victim PLL is buffered by an output clipping buffer for the output node (output) to remove any amplitude distortion. The VCO of the victim PLL resonates at 4 GHz, and the aggressor VCO resonates at 4.4 GHz. The correction frequency added to the capacitor tuning bank of the VCO of the victim PLL is at the frequency difference of 400 MHz. In FIG. 6, this correction frequency is the compensation signal and is represented by a control voltage source ($V_{control}$).

FIG. 7 illustrates the simulation results in the time domain. In particular, FIG. 7 includes a first line that is a time domain representation of the output frequency of the victim VCO of FIG. 6 with only the aggressor, or interferer, present. FIG. 7 also includes a second line that is a time domain representation of the output frequency of the victim VCO of FIG. 6 with both the aggressor (i.e., the interferer) and the correction (i.e., the compensation signal) present. As is clear, the variation in the output frequency of the victim VCO is substantially improved by the use of the correction (i.e., the compensation signal).

FIG. 8 illustrates the simulation results in the frequency domain. In particular, FIG. 8 illustrates the output of the victim VCO of FIG. 6 in the frequency domain for (a) the case where there is no correction (i.e., the aggressor or interferer is present but there is no correction or compensation signal) and (b) the case where the correction or compensation signal is present. As illustrated, when there is no correction, the magnitude of the frequency components (i.e., the undesired sidebands due to the interferer) at 3.6 GHz and 4.4 GHz are approximately 18 dB higher that when the correction or compensation signal is applied. The largest source of mismatch in this compensation is 1/sqrt(LC) behavior of the VCO core oscillation frequency to the tuning capacitor value. This can be overcome by predistorting the control signal of the VCO accordingly. Note that the simulation of FIGS. 6-8 does not include the AM correction loop of FIG. 4.

The systems and methods described herein mitigate the known interferer to the CO 20 while requiring little additional hardware. The only addition are the filtering and predistortion subsystem 30, the correlator 32, the LPF 34, the multiplier 36, and the adder 38, which may, in one embodiment, be implemented in one or more digital circuits. Further, the systems and methods disclosed herein can be used to compensate for either continuous wave or modulated interferers. Lastly, as discussed above, by using the correlator loop, the compensation is not limited by the SNR of the phase detector 24.

Further, while the systems and methods described herein are described on their own, they may be used together with other systems and methods to further mitigate interference at the CO 20 of the PLL 22. For example, the systems and methods disclosed herein may be used together with those described in commonly owned and assigned U.S. patent application Ser. No. 14/259,485, entitled OSCILLATOR CROSSTALK COMPENSATION, which was filed on Apr. 23, 2014 and/or commonly owned and assigned U.S. patent application Ser. No. 14/264,506, entitled LOCAL OSCIL- LATOR INTERFERENCE CANCELLATION, which was filed on Apr. 29, 2014, both of which are hereby incorporated herein by reference in their entireties.

The following acronyms are used throughout this disclosure.

3GPP Third Generation Partnership Project
AM Amplitude Modulation
CO Controlled Oscillator
CW Continuous Wave
DAC Digital-to-Analog Converter
DCO Digitally Controlled Oscillator
GHz Gigahertz
kHz Kilohertz
LC Inductor Capacitor
LO Local Oscillator
LPF Low-Pass Filter
LTE Long Term Evolution
LUT Look-Up Table
MHz Megahertz
mS Milli-Siemens
PD Phase Detector
PLL Phase-Locked Loop
PM Phase Modulation
SNR Signal-to-Noise Ratio
VCO Voltage Controlled Oscillator Those skilled in the art will recognize improvements and modifications to the embodiments of the present disclosure. All such improvements and modifications are considered within the scope of the concepts disclosed herein and the claims that follow.

What is claimed is:

1. A system comprising:
   a phase-locked loop, comprising:
      a phase detector configured to generate a phase detector output signal indicative of a phase difference between a reference signal and a feedback signal, the feedback signal being indicative of a local oscillator, LO, output signal generated by the phase-locked loop;
      a low-pass filter configured to filter the phase detector output signal to provide a control signal; and
      a controlled oscillator configured to generate the LO output signal of the phase-locked loop based on a compensated control signal; and
   a compensation system configured to:
      generate a compensation signal based on a complex correlation of the phase detector output signal and a signal derived from a replica of a known interferer to the controlled oscillator; and
      apply the compensation signal to the control signal provided by the low-pass filter of the phase-locked loop to thereby provide the compensated control signal for the controlled oscillator of the phase-locked loop.

2. The system of claim 1 wherein the known interferer is a modulated signal, and the replica of the known interferer is also a modulated signal.

3. The system of claim 1 wherein the compensation signal is effectively an opposite of the known interferer.

4. The system of claim 1 wherein the compensation system comprises:
   a complex correlator configured to perform a complex correlation of the signal derived from the replica of the known interferer and the phase detector output signal to provide a correlation signal;
   circuitry configured to process the correlation signal and the replica of the known interferer to provide the compensation signal; and
   combiner circuitry configured to combine the control signal from the low-pass filter of the phase-locked loop and the compensation signal to provide the compensated control signal for the controlled oscillator of the phase-locked loop.

5. The system of claim 1 wherein the compensation system comprises:
   a complex correlator comprising a first input configured to receive the signal derived from the replica of the known interferer, a second input coupled to an output of the phase detector of the phase-locked loop, and an output, the complex correlator configured to perform a complex correlation of the signal derived from the replica of the known interferer and the phase detector output signal to provide a correlation signal at the output of the complex correlator;
   a low-pass filter comprising an input coupled to the output of the complex correlator and an output, the low-pass filter configured to filter the correlation signal to provide a filtered correlation signal;
   a complex multiplier comprising a first input configured to receive the replica of the known interferer, a second input coupled to the output of the low-pass filter of the compensation system, and an output, the complex multiplier configured to multiply the replica of the known interferer and the filtered correlation signal to provide the compensation signal at the output of the complex multiplier; and
   an adder comprising a first input coupled to an output of the low-pass filter of the phase-locked loop, a second input coupled to the output of the complex multiplier of the compensation system, and an output, the adder configured to add the control signal from the low-pass filter of the phase-locked loop and the compensation signal from the multiplier of the compensation system to provide the compensated control signal at the output of the adder.

6. The system of claim 1 wherein the compensation system further comprises circuitry configured to compensate for an amplitude modulation of the LO output signal as a function of the compensated control signal provided to the controlled oscillator.

7. The system of claim 6 wherein the circuitry configured to compensate for the amplitude modulation of the LO output signal comprises:
   a look-up table configured to output a bias control signal as a function of the compensated control signal; and
   biasing circuitry configured to adjust a bias of the controlled oscillator based on the bias control signal.

8. The system of claim 7 wherein the biasing circuitry is configured to adjust a bias current of the controlled oscillator based on the bias control signal.

9. The system of claim 7 wherein the biasing circuitry is configured to adjust a supply voltage of the controlled oscillator based on the bias control signal.

10. The system of claim 1 wherein:
   the phase-locked loop, comprises:
      the phase detector comprising:
         a first input configured to receive the reference signal;
         a second input configured to receive the feedback signal indicative of the LO output signal of the phase-locked loop; and
         an output, the phase detector being configured to generate the phase detector output signal indicative of the phase difference between the reference signal and the feedback signal at the output of the phase detector;

the low-pass filter comprising an input coupled to the output of the phase detector and an output, the low-pass filter being configured to filter the phase detector output signal to provide the control signal at the output of the low-pass filter; and the controlled oscillator having a control input and an output, the controlled oscillator being configured to receive the compensated control signal at the control input of the controlled oscillator and generate the LO output signal at the output of the controlled oscillator based on the compensated control signal; and the compensation system, comprises:
- a complex correlator comprising a first input configured to receive the signal derived from the replica of the known interferer, a second input coupled to the output of the phase detector of the phase-locked loop, and an output, the complex correlator configured to perform complex correlation of the signal derived from the replica of the known interferer and the phase detector output signal to provide a correlation signal at the output of the complex correlator;
- a low-pass filter comprising an input coupled to the output of the complex correlator and an output, the low-pass filter configured to filter the correlation signal to provide a filtered correlation signal;
- a complex multiplier comprising a first input configured to receive the replica of the known interferer, a second input coupled to the output of the low-pass filter of the compensation system, and an output, the complex multiplier configured to multiply the replica of the known interferer and the filtered correlation signal to provide the compensation signal at the output of the complex multiplier; and
- an adder comprising a first input coupled to the output of the low-pass filter of the phase-locked loop, a second input coupled to the output of the complex multiplier of the compensation system, and an output, the adder configured to add the control signal from the low-pass filter of the phase-locked loop and the compensation signal from the complex multiplier of the compensation system to provide the compensated control signal at the output of the adder.

11. The system of claim 1 wherein the compensation system further comprises one or more components configured to process the replica of the known interferer to compensate for one or more loop characteristics of the phase-locked loop to thereby provide the signal derived from the replica of the known interferer.

12. A method of compensating for an interferer to a controlled oscillator of a phase-locked loop comprising a phase detector configured to generate a phase detector output signal indicative of a phase difference between a reference signal and a feedback signal indicative of a local oscillator, LO, output signal generated by the phase-locked loop, a low-pass filter configured to filter the phase detector output signal to provide a control signal, and the controlled oscillator is configured generate the LO output signal of the phase-locked loop based on a compensated control signal, comprising:
- generating a compensation signal based on a complex correlation of the phase detector output signal and a signal derived from a replica of a known interferer to the controlled oscillator; and
- applying the compensation signal to the control signal provided by the low-pass filter of the phase-locked loop to thereby provide the compensated control signal for the controlled oscillator of the phase-locked loop.

13. The method of claim 12 wherein the known interferer is a modulated signal, and the replica of the known interferer is also a modulated signal.

14. The method of claim 12 wherein the compensation signal is effectively an opposite of the known interferer.

15. The method of claim 12 wherein generating the compensation signal comprises:
- performing a complex correlation of the signal derived from the replica of the known interferer and the phase detector output signal to provide a correlation signal; and
- processing the correlation signal and the modulated signal to provide the compensation signal.

16. The method of claim 15 wherein applying the compensation signal to the control signal comprises combining the control signal from the low-pass filter of the phase-locked loop and the compensation signal to provide the compensated control signal for the controlled oscillator of the phase-locked loop.

17. The method of claim 12 wherein:
generating the compensation signal comprises:
- performing a complex correlation of the signal derived from the replica of the known interferer and the phase detector output signal to provide a correlation signal at an output of a complex correlator;
- low-pass filtering the correlation signal to provide a filtered correlation signal; and
- performing a complex multiplication of the replica of the known interferer and the filtered correlation signal to provide the compensation signal; and applying the compensation signal to the control signal comprises adding the control signal from the low-pass filter of the phase-locked loop and the compensation signal from a multiplier of the compensation system to provide the compensated control signal.

18. The method of claim 12 further comprising compensating for an amplitude modulation of the LO output signal as a function of the compensated control signal provided to the controlled oscillator.

19. The method of claim 18 wherein compensating for the amplitude modulation of the LO output signal comprises:
- generating a bias control signal as a function of the compensated control signal using a preconfigured look-up table; and
- adjusting a bias of the controlled oscillator based on the bias control signal.

20. The method of claim 19 wherein adjusting the bias of the controlled oscillator comprises adjusting a bias current of the controlled oscillator based on the bias control signal.

21. The method of claim 19 wherein adjusting the bias of the controlled oscillator comprises adjusting a supply voltage of the controlled oscillator based on the bias control signal.

22. The method of claim 12 further comprising processing the replica of the known interferer to compensate for one or more loop characteristics of the phase-locked loop to thereby provide the signal derived from the replica of the known interferer.

23. A wireless transmitter comprising:
a phase-locked loop, comprising:
- a phase detector configured to generate a phase detector output signal indicative of a phase difference between a reference signal and a feedback signal, the feedback signal being indicative of a local oscillator, LO, output signal generated by the phase-locked loop;
- a low-pass filter configured to filter the phase detector output signal to provide a control signal; and a controlled oscillator configured to generate the LO output signal of the phase-locked loop based on a compensated control signal; and a compensation system configured to:

generate a compensation signal based on a complex correlation of the phase detector output signal and a signal derived from a replica of a known interferer to the controlled oscillator; and apply the compensation signal to the control signal provided by the low-pass filter of the phase-locked loop to thereby provide the compensated control signal for the controlled oscillator of the phase-locked loop.

\* \* \* \* \*